United States Patent [19]

Hoge et al.

[11] 4,388,132
[45] Jun. 14, 1983

[54] METHOD OF ATTACHING A PROTECTIVE FILM TO AN INTEGRATED CIRCUIT

[75] Inventors: Carl E. Hoge, Encinitas; Gregory K. Lin, San Diego, both of Calif.

[73] Assignee: Burroughs Corporation, Detroit, Mich.

[21] Appl. No.: 268,813

[22] Filed: Jun. 1, 1981

[51] Int. Cl.³ .................. B32B 31/12; B32B 7/12
[52] U.S. Cl. .................. 156/153; 29/829;
156/295; 174/35 R; 174/68.5; 339/17 A;
339/17 B; 339/17 T; 339/143 R; 428/192
[58] Field of Search ........... 156/153, 295; 29/829;
428/192; 73/64.4; 339/17 A, 17 B, 17 T, 143 R;
174/68.5, 35 R

[56] References Cited

U.S. PATENT DOCUMENTS 3,193,424 7/1965 Scott .................. 156/153 X
3,852,690 12/1974 Telfer .................. 29/829
3,963,551 6/1976 Marlinski .................. 156/295

FOREIGN PATENT DOCUMENTS 2046698 11/1980 United Kingdom .................. 156/295

Primary Examiner—Robert A. Dawson
Attorney, Agent, or Firm—Charles J. Fassbender; J. Ronald Richbourg; Kevin R. Peterson

[57] ABSTRACT

In the disclosed method, a protective film is attached to an integrated circuit by the steps of placing a droplet of an adhesive on the surface of the integrated circuit; dropping the film on the droplet of adhesive; squeezing the droplet into a layer with the weight of the film; and aligning corresponding edges of the film and integrated circuit via the surface tension in the adhesive.

10 Claims, 10 Drawing Figures

METHOD OF ATTACHING A PROTECTIVE FILM TO AN INTEGRATED CIRCUIT

BACKGROUND OF THE INVENTION

This invention relates to methods for applying a protective film to an integrated circuit; and more particularly to methods for applying a protective film to a dynamic memory integrated circuit for the purpose of protecting that memory against alpha-particle radiation.

In a dynamic memory integrated circuit, each memory cell is comprised of a capacitor for storing charges that represent the information in the cell. Typically, this capacitor is formed by the combination of a selected surface region of a semiconductor substrate, an insulating layer lying on that region, and a conductive layer lying on the insulating layer. With that structure, the selected surface region of the semiconductor substrate and the conductive layer over it form two parallel plates of the capacitor.

Typically, thousands of such capacitors are formed in a single substrate of which the total area is less than 1/10 of a square inch; and they are interconnected in an array by conductive lines and transistors. These lines and transistors generally are only 1-5 micrometers wide. Then, in operation, the charges representing information are selectively read from and written into the various capacitors.

Over the past several years the tendency in the dynamic memory art has been to continually increase the number of memory cells that are fabricated in a single semiconductor substrate. To a large extent this has been achieved by continually reducing the size of each individual capacitor. But as the size of each capacitor is decreased, the amount of charge which it can hold also decreases. Consequently, small quantities of charge, such as those generated at random in the semiconductor substrate by alpha-particle radiation, can combine with and offset the charges which are normally in the capacitor representing information. And this results in what is known as "soft errors".

To overcome this problem, protective films have been attached to the surface of the dynamic memory. These protective films act as barriers to the alpha particles, and thus they prevent the generation of unwanted charges in the semiconductor substrate.

In the prior art, the film was attached to the memory by applying a glue to the memory's surface; and thereafter the film was pressed, either manually or by machines, against the glue in order to cause sticking and bonding. But this pressing step is a very delicate operation; because if too much force is used, any one of the thin interconnections in the memory will fracture. And that makes the entire memory useless.

Also, the film must be aligned very accurately with the surface of the memory to insure that it covers all the memory cells. Otherwise, if the film is misaligned such that some of the memory cells are exposed, those cells would be susceptible to alpha-particle radiation. But this alignment step is difficult to perform accurately because the memories are so small.

In the prior art, the above attaching and aligning steps were performed either by machinery that was highly accurate, or by technicians that were highly skilled. But this solution for the problem is undesirably expensive.

Accordingly, a primary object of the invention is to provide an improved method of attaching a protective film to an integrated circuit.

BRIEF SUMMARY OF THE INVENTION

This and other objectives are accomplished in accordance with the invention by a method wherein:

a droplet of an adhesive is placed on the surface of the integrated circuit;

the film is dropped on the droplet such that corresponding edges of the film and the circuit are offset from each other;

and the corresponding offset edges are aligned with each other by surface tension in the fluid adhesive.

BRIEF DESCRIPTION OF THE DRAWINGS

Various features and advantages of the invention are discussed in the following Detailed Description in conjunction with the accompanying drawings wherein.

DETAILED DESCRIPTION OF THE INVENTION

Figure 1:
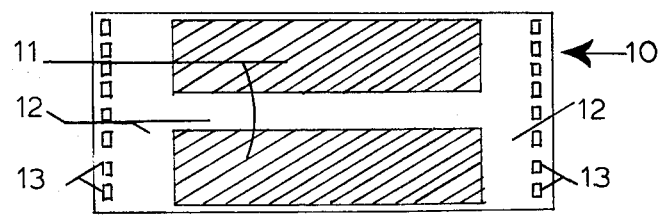
FIG. 1 is a top view of a dynamic memory integrated circuit chip on which the protective film is to be applied.

Referring now to the Figures, the details of a preferred method for applying a protective film to the surface of an integrated circuit will be described. First, with reference to FIG. 1, there is illustrated a top view of a dynamic memory integrated circuit chip 10 on which the protective film is to be applied. In chip 10, the memory cells occupy a region 11; whereas other supporting circuits, such as sense amplifiers and decoders, occupy a region 12. Input/output pads (I/O pads) 13 provide a means for sending electrical signals to and receiving electrical signals from the memory chip.

Chip 10 may, of course, be of various physical sizes depending upon the numnber of memory cells that it contains. As one specific example, chip 10 contains 65,000 memory cells. That chip is 300 mils×150 mils and is about 20 mils thick; pads 13 are about 5 mils×5 mils; and the distance between the pads 13 and the memory cells 11 is about 40 mils. (Mils, as used herein, means 1/1000 of an inch).

Figure 2:
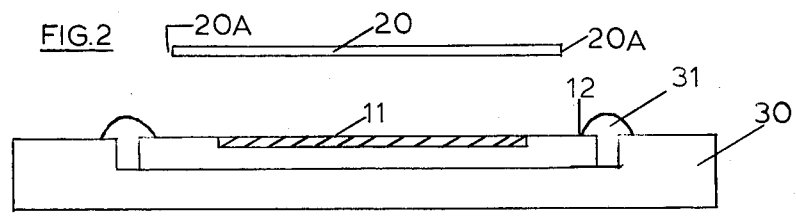
FIG. 2 is a cross-sectional view of the integrated circuit of FIG. 1 mounted in an integrated circuit package prior to its attachment to the protective film.

Now, in accordance with the present invention, a protective film 20 is to be applied to chip 10 over the region 11 that is occupied by the memory cells. This protective film 20 is illustrated in cross-sectional view prior to its attachment to chip 10 in FIG. 2. Film 20 may be comprised of any material that provides a barrier against alpha-particle radiation. And in one preferred embodiment, film 20 is comprised of a polyimide, such as a Pyromellitimide type of material.

Film 20 can be of any length so long as it is longer than the length of region 11 and shorter than chip 10. Preferably, the length of film 20 is such that its ends 20a can be placed midway between I/O pads 13 and the ends of region 11. This allows film 20 to be offset slightly in a lengthwise direction from the position shown in FIG. 2 and still cover the memory cells.

By comparison, the width of film 20 preferably equals the width of chip 10. And since the memory cells 11 occupy almost the entire width of chip 10, essentially no misalignment of film 20 with respect to the chip's width is tolerable. Otherwise, some of the memory cells in region 11 would be uncovered which would expose them to alpha-particle radiation.

Figure 3A:
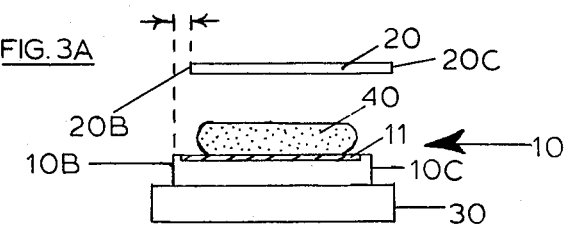
FIGS. 3A-3C illustrate the steps of one preferred method of attaching the protective film to the integrated circuit of FIG. 1.
Figure 3B:
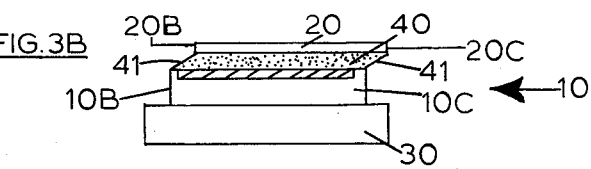
Figure 3C:
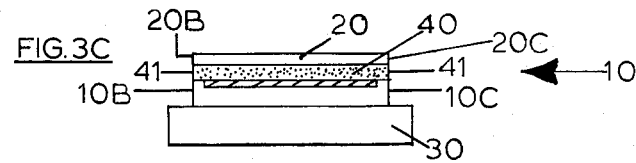

Reference should now be made to FIGS. 3A-3C where the key steps of the present method are illustrated. Note in these Figures that the steps are carried out after chip 10 has been attached to an integrated circuit package 30. This attachment includes the bonding of leads 31 from the I/O pads 13 to corresponding pads on the package. It is to be understood, however, that as an alternative, chip 10 can be attached to package 30 after the steps of FIGS. 3A-3C are carried out.

Consider now FIG. 3A. As is there illustrated, a droplet of an adhesive material 40 is placed on region 11. Material 40 can be any adhesive that has a fluid phase. That fluid phase may be reached either by melting or by mixing the adhesive with a solvent. One example of the former is a thermoplastic material based on diaminophenylindane; and one example of the latter is the adhesive XU-218 by Ciba Geigy. There are many suitable solvents for the XU-218 adhesive, such as methylene chloride or tetrahydrofuran, for example.

After adhesive 40 is disposed at its fluid phase as illustrated in FIG. 3A, the protective film 20 is positioned over it. This positioning may be done either manually or automatically by machinery. Preferably, the distance between film 20 and adhesive 40 is less than one-quarter of an inch.

Note that in this positioning step, film edges 20b and 20c need not align perfectly with corresponding edges 10b and 10c of the integrated circuit chip. For example, those edges may be offset laterally by 1-20 mils; or they may be offset rotationally by 1°-10°. This is because any such misalignment at this stage will be corrected by the subsequent steps of the process.

After film 20 is positioned as described above, it is dropped onto the adhesive 40 as illustrated in FIG. 3B. Then the film's weight squeezes adhesive 40 into a uniformly thick layer which covers the entire surface of the film that faces the integrated circuit chip. For this to occur, it is important that the film's weight and the adhesive's viscosity be properly matched. As a specific example, a 0.005 inch thick polyimide film having a width of 150 mils and a length of 260 mils will weigh approximately 4.5 milligrams; and this matches for the above purposes with a cyclohexanone solution adhesive having viscosity of approximately 200 centipoise.

As film 20 squeezes the fluid adhesive 40, sidewalls 41 are formed between the misaligned corresponding edges 10b-20b and 10c-20c. This is illustrated in FIG. 3B. However, the surface tension in fluid 40 operates in a manner which tends to reduce the area of those sidewalls 41. And that surface area is minimized when the corresponding edges 10b-20b and 10c-20c align with each other.

Thus in response to the surface tension forces in the fluid adhesive 40, film 20 moves from its misaligned position of FIG. 3B to its aligned position of FIG. 3C. This movement occurs very quickly and is complete in a fraction of a second. Also, the FIG. 3C position of film 20 is very stable, since any perturbation from it will be resisted by the surface tension forces.

After film 20 has attained its aligned position of FIG. 3C, the fluid adhesive is hardened. In the case of a thermoplastic adhesive, this hardening is achieved by cooling the adhesive to room temperature. And in the case of an adhesive which attains its fluid state by mixing it with a solvent, this hardening is achieved by heating the structure of FIG. 3C to vaporize the solvent out of the mixture.

One advantage of the above-described method is that no mechanical or manual pressing of film 20 onto the integrated circuit chip 10 is required. This is important because it eliminates damage to the integrated circuit 10 which can occur if too large a force is applied to the film. Another advantage of the above-described method is that all misalignment between the corresponding edges 10b-20b and 10c-20c is eliminated. And this is important because misalignment of those edges would expose a portion of the memory cells in region 11 to alpha-particle radiation.

Figure 4A:
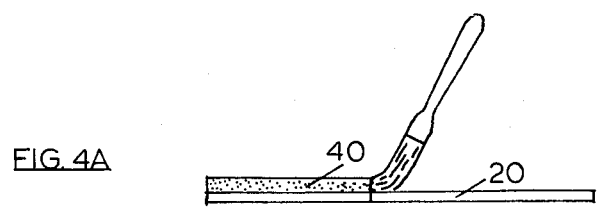
FIGS. 4A-4B illustrate one modification to the steps of FIGS. 3A-3C.
Figure 4B:
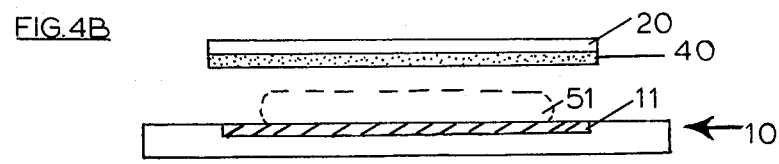
Figure 5:
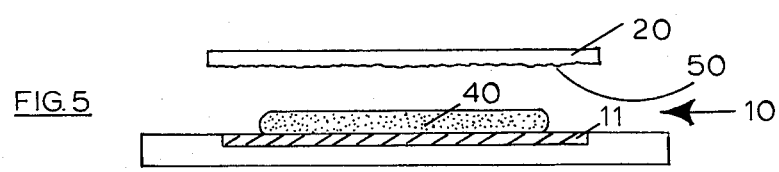
FIG. 5 illustrates another modification to the steps of FIGS. 3A-3C.

Referring now to FIGS. 4 through 6, several variations and modifications to the above steps will be described. Consider first the modified steps of FIGS. 4A and 4B. To begin, a layer of the above-described adhesive material 40 is formed on a surface of film 20. Various techniques may be utilized to form this layer, such as brushing, for example.

After the adhesive layer 40 has been applied to film 20, the film is adhered to the integrated circuit chip 10. This is achieved by dropping the film with its adhesive layer onto the integrated circuit 10 as illustrated in FIG. 4B. Then, surface tension in the fluid adhesive layer 40 will operate to align the film with chip 10 as was previously described in conjunction with FIGS. 3B and 3C.

Note also, that the composite structure of film 20 with its adhesive layer need not be adhered to circuit 10 immediately after the adhesive layer is applied to the film. Instead, the adhesive layer may be hardened on film 20 for temporary storage; and subsequently when the step of FIG. 4B is to be performed, the adhesive layer on film 20 may be converted back to its fluid state.

If the adhesive layer on film 20 is comprised of a thermoplastic material, it is hardened for temporary storage by cooling it to room temperature. And if the adhesive layer includes a solvent, it is hardened for temporary storage by vaporizing the solvent from the adhesive. In this latter case, the hardened adhesive layer is subsequently converted back to its fluid state by disposing a droplet of solvent onto the integrated circuit 10 prior to the dropping step of FIG. 4B. This droplet solvent is indicated in FIG. 4B by reference numeral 51.

Referring next to FIG. 5, still another modification of the above will be described. In FIG. 5, the step being illustrated is similar to the step of FIG. 3A. But in order to promote bonding between film 20 and the adhesive 40, the surface of film 20 which makes contact with the adhesive is roughened before any contact is made. This roughened surface is indicated in FIG. 5 by reference numeral 50; and preferably it is obtained by plasma etching or mechanically abrading the film.

Figure 6A:
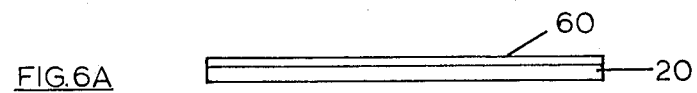
FIGS. 6A-6B illustrate still another modification to the steps of FIGS. 3A-3C.
Figure 6B:
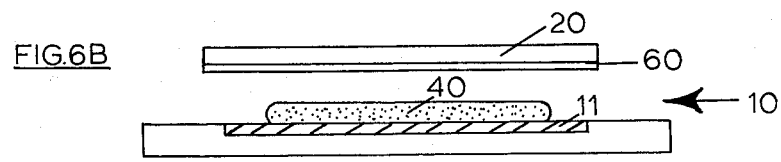

Bonding between film 20 and the adhesive 40 may also be promoted by the modified steps of FIGS. 6A and 6B. There, a layer of a coupling agent 60 is applied to the film prior to its contact with the adhesive. A coupling agent as the term is used herein is defined as any organic substance having long carbon chains with a chemical grouping at one end which readily links to film 20. One suitable coupling agent, for example, is glycidoxypropyltrimethoxy silane. Then, after the coupling agent is applied to film 20, the composite structure is dropped onto the fluid adhesive 40 as illustrated in FIG. 6B which in turn is followed by the previously described steps of FIGS. 3B and 3C.

Various preferred methods of applying a protective film to the surface of an integrated circuit in accordance with the invention have now been described in detail. In addition, however, various changes and modifications may be made to these details without departing from the nature and spirit of the invention. For example, the circuit to which the protective film is being applied may be integrated into a wafer as well as a chip; and the circuit could be any circuit, not only a memory. Thus it is to be understood that the invention is not limited to said details, but is defined by the appended claims.

What is claimed is:

1. A method of attaching a protective film to a planar surface of an integrated circuit; said film having a perimeter with edges that correspond to and precisely overlie other edges along the perimeter of said planar surface of said integrated circuit when said film and said circuit are in alignment with each other; said method including the steps of:
   disposing an adhesive in a fluid phase between said surface of said circuit and the surface of said film such that said corresponding edges are in an offset position from each other;
   moving said film, by the surface tension of said fluid adhesive between said surfaces and without any manual or mechanical pressing, from said offset position to another position where said corresponding edges align with each other; and
   hardening said adhesive subsequent to said moving step.

2. A method according to claim 1 wherein said disposing step further includes the substeps of:
   placing a droplet of said adhesive on said surface of said integrated circuit;
   dropping said film on said droplet; and
   squeezing said droplet into said layer with the weight of said film.

3. A method according to claim 1 wherein said disposing step further includes the substeps of:
   forming a layer of said adhesive on said surface of said film; and subsequently
   dropping said film onto said surface of said integrated circuit with said adhesive layer lying therebetween.

4. A method according to claim 1 wherein said disposing step further includes the substep of heating said adhesive to obtain said fluid phase.

5. A method according to claim 1 wherein said disposing step further includes the substep of mixing said adhesive with a solvent to obtain said fluid phase.

6. A method according to claim 1 and further including the substep of including a coupling agent in said adhesive layer to promote bonding between said film and said integrated circuit.

7. A method according to claim 1 and further including the substep of roughening said surface of said film to promote bonding between said film and said integrated circuit.

8. A method according to claim 1 wherein said integrated circuit is a dynamic memory and said protective film is a barrier to alpha-particle radiation.

9. A method according to claim 1 wherein at least two edges on said film are aligned with corresponding edges on said circuit.

10. A method of attaching one flat surface of a planar member to another flat surface of another planar member; said one flat surface and said another flat surface having corresponding edges along their respective perimeters that precisely overlie edges other when said one and said another surfaces are in alignment; said method including the steps of:
    providing an adhesive in a fluid phase between said one and said another flat surfaces such that said corresponding edges are offset from each other and a sidewall of said adhesive extends between said corresponding offset edges;
    aligning said corresponding offset edges by contracting said sidewall of said fluid adhesive between said corresponding offset edges via surface tension in said fluid adhesive and without any manual or mechanical pressing; and
    hardening said adhesive subsequent to said aligning step.

* * * * *